(12) United States Patent
Kim et al.

(10) Patent No.: US 11,476,436 B2
(45) Date of Patent: Oct. 18, 2022

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Jaeik Kim, Yongin-si (KR); Jaesik Kim, Yongin-si (KR); Yeonhwa Lee, Yongin-si (KR); Joongu Lee, Yongin-si (KR); Sehoon Jeong, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 16/363,813

(22) Filed: Mar. 25, 2019

(65) Prior Publication Data
US 2019/0326535 A1    Oct. 24, 2019

(30) Foreign Application Priority Data
Apr. 24, 2018 (KR) .......................... 10-2018-0047314

(51) Int. Cl.
*H01L 51/50* (2006.01)
*H01L 51/52* (2006.01)
(Continued)

(52) U.S. Cl.
CPC ........ *H01L 51/508* (2013.01); *H01L 27/3246* (2013.01); *H01L 51/5004* (2013.01);
(Continued)

(58) Field of Classification Search
CPC ............. H01L 27/3211; H01L 51/5056; H01L 51/5088; H01L 2251/552
See application file for complete search history.

(56) References Cited

U.S. PATENT DOCUMENTS 8,871,545 B2   10/2014  Lee et al.
8,877,532 B2   11/2014  Hiroki et al.
(Continued)

FOREIGN PATENT DOCUMENTS

| JP | 2012-216501 A | 11/2012 |
|---|---|---|
| KR | 10-2017-0048360 A | 5/2017 |
| KR | 10-2017-0102145 A | 9/2017 |

*Primary Examiner* — Julio J Maldonado
*Assistant Examiner* — Stanetta D Isaac
(74) *Attorney, Agent, or Firm* — Lewis Roca Rothgerber Christie LLP

(57) ABSTRACT

An organic light-emitting display apparatus and a manufacturing method thereof have improved process stability and reliability by reducing damage to the organic light-emitting display apparatus during a manufacturing process. The organic light-emitting display apparatus includes: a substrate, a plurality of pixel electrodes, a pixel defining film, a plurality of hole control layers respectively arranged on the pixel electrodes, a plurality of emission layers respectively arranged on the hole control layers, a plurality of buffer layers respectively arranged on the emission layers, each of the buffer layers having a highest occupied molecular orbital (HOMO) energy level greater than the HOMO energy level of each of the plurality of emission layers, and an opposite electrode integrally provided over the buffer layers.

10 Claims, 15 Drawing Sheets

(51) Int. Cl.
  *H01L 51/56* (2006.01)
  *H01L 27/32* (2006.01)
(52) U.S. Cl.
  CPC ...... *H01L 51/5036* (2013.01); *H01L 51/5092* (2013.01); *H01L 51/5206* (2013.01); *H01L 51/56* (2013.01); *H01L 2251/303* (2013.01); *H01L 2251/552* (2013.01)

(56) References Cited

U.S. PATENT DOCUMENTS

| | | | |
|---|---|---|---|
| 9,899,636 B2 | 2/2018 | Defranco et al. | |
| 10,134,991 B2 | 11/2018 | Choi et al. | |
| 2015/0044801 A1 | 2/2015 | Lee et al. | |
| 2015/0318509 A1* | 11/2015 | Song | H01L 51/5016 257/40 |
| 2016/0079327 A1* | 3/2016 | Matsumi | H01L 51/5072 257/40 |
| 2017/0033306 A1* | 2/2017 | Song | H01L 51/5064 |
| 2017/0125487 A1* | 5/2017 | Song | H01L 51/56 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2018-0047314, filed on Apr. 24, 2018, in the Korean Intellectual Property Office, the entire content of which is incorporated by reference.

BACKGROUND

1. Field

One or more embodiments of the present disclosure relate to an organic light-emitting display apparatus and a method of manufacturing the organic light-emitting display apparatus, and for example, to an organic light-emitting display apparatus having improved process stability and reliability by reducing damage to an organic light-emitting device in a manufacturing process, and a method of manufacturing the organic light-emitting display apparatus.

2. Description of the Related Art

Organic light-emitting display apparatuses are display apparatuses in which a pixel includes an organic light-emitting device. An organic light-emitting device may include a pixel electrode, an opposite electrode facing the pixel electrode, and an emission layer provided between the pixel electrode and the opposite electrode.

For an organic light-emitting display apparatus implementing full color, respective pixel areas may emit light having colors that are different from one another, and an emission layer of each pixel and an opposite electrode integrally formed in a plurality of pixels may be formed using a deposition mask. As the resolution of an organic light-emitting display apparatus gradually increases, the width of an open slit of a mask used during a deposition process gradually decreases, and also dispersion thereof is demanded to be gradually reduced. Furthermore, to manufacture a high-resolution organic light-emitting display apparatus, a shadow effect should be reduced or eliminated. Accordingly, a method of performing a deposition process when a substrate and a mask are in close contact with each other may be used.

However, when a deposition process is performed when a substrate and a mask are in close contact with each other, the mask may damage an upper layer of a pixel electrode.

SUMMARY

One or more embodiments include an organic light-emitting display apparatus having improved process stability and reliability by reducing damage to an organic light-emitting device in a manufacturing process, and a manufacturing method thereof Additional aspects of embodiments will be set forth in part in the description which follows and, in part, will be apparent from the description, or may be learned by practice of the presented embodiments.

According to one or more embodiments, a display apparatus includes a substrate; a plurality of pixel electrodes patterned on the substrate to be arranged spaced apart from each other; a pixel defining film defining a pixel area by exposing a center portion of each of the plurality of pixel electrodes and covering an edge of each of the plurality of pixel electrodes; a plurality of hole control layers respectively arranged on the plurality of pixel electrodes that are exposed through the pixel area; a plurality of emission layers respectively arranged on the plurality of hole control layers; a plurality of buffer layers respectively arranged on the plurality of emission layers, each of the plurality of buffer layers having a highest occupied molecular orbital (HOMO) energy level greater than the HOMO energy level of each of the plurality of emission layers; and an opposite electrode integrally provided over the plurality of buffer layers.

A lowest unoccupied molecular orbital (LUMO) energy level of each of the plurality of buffer layers may have a value between a work function of the opposite electrode and the LUMO energy level of each of the plurality of emission layers.

Each of the plurality of hole control layers may include at least one selected from a hole injection layer (HIL) and a hole transport layer (HTL).

The display apparatus may further include an electronic control layer that is integrally provided between the plurality of buffer layers and the opposite electrode.

The lowest unoccupied molecular orbital (LUMO) energy level of each of the plurality of buffer layers may have a value between the LUMO energy level of the electronic control layer and the LUMO energy level of the plurality of emission layers.

The electronic control layer may include at least one selected from an electron injection layer (EIL) and an electron transport layer (EML).

The plurality of buffer layers may include a low molecular weight organic material.

The plurality of buffer layers may include an electron transport material.

The plurality of buffer layers may include a metal oxide material.

The plurality of buffer layers may be arranged directly on the plurality of emission layers to contact the plurality of emission layers.

End portions of the plurality of hole control layers, the plurality of emission layers, and the plurality of buffer layers, which are on any one of the plurality of pixel electrodes, may be aligned with one another.

The plurality of pixel electrodes may include a first pixel electrode for red emission (e.g., configured to emit red light), a second pixel electrode for green emission (e.g., configured to emit green light), and a third pixel electrode for blue emission (e.g., configured to emit blue light), and the plurality of emission layers include a red emission layer (e.g., a layer configured to emit red light) provided corresponding to the first pixel electrode, a green emission layer (e.g., a layer configured to emit green light) provided corresponding to the second pixel electrode, and a blue emission layer (e.g., a layer configured to emit blue light) provided corresponding to the third pixel electrode.

According to one or more embodiments, a method of manufacturing a display apparatus includes: (a) forming a first pixel electrode for first color emission, a second pixel electrode for second color emission, and a third pixel electrode for third color emission, wherein the first pixel electrode for first color emission, the second pixel electrode for second color emission, and the third pixel electrode for third color emission are patterned on a substrate to be spaced apart from one another; (b) forming a first lift-off layer including a fluoropolymer on the first to third pixel electrodes; (c) forming a first photoresist on the first lift-off layer; (d) sequentially forming a first opening and a second opening in the first photoresist and the first lift-off layer to expose the first pixel electrode, wherein the first photoresist and the first lift-off layer are formed at positions corresponding to the first pixel electrode; (e) sequentially forming a first hole control layer, a first emission layer, and a first buffer layer, on the first pixel electrode, through the first opening and the second opening; (f) removing the first lift-off layer and the first photoresist; sequentially repeating operations (b) to (f) with respect to the second pixel electrode; and sequentially repeating operations (b) to (f) with respect to the third pixel electrode.

The sequentially repeating of operations (b) to (f) with respect to the second pixel electrode may include: (b) forming a second lift-off layer on the second to third pixel electrodes, the second lift-off layer including a fluoropolymer; (c) forming a second photoresist on the second lift-off layer; (d) sequentially forming a first opening and a second opening in the second photoresist and the second lift-off layer to expose the second pixel electrode, wherein the second photoresist and the second lift-off layer are formed at positions corresponding to the second pixel electrode; (e) sequentially forming a second hole control layer, a second emission layer, and a second buffer layer, on the second pixel electrode, through the first opening and the second opening; and (f) removing the second lift-off layer and the second photoresist, wherein the second buffer layer protects the second emission layer in the removing of the second lift-off layer and the second photoresist.

The sequentially repeating of operations (b) to (f) with respect to the third pixel electrode may include: (b) forming a third lift-off layer on the third pixel electrodes, the third lift-off layer including a fluoropolymer; (c) forming a third photoresist on the third lift-off layer; (d) sequentially forming a first opening and a second opening in the third photoresist and the third lift-off layer to expose the third pixel electrode, wherein the third photoresist and the third lift-off layer are formed at positions corresponding to the third pixel electrode; (e) sequentially forming a third hole control layer, a third emission layer, and a third buffer layer, on the third pixel electrode, through the first opening and the second opening; and (f) removing the third lift-off layer and the third photoresist, wherein the third buffer layer protects the third emission layer in the removing of the third lift-off layer and the third photoresist.

The method may further include forming an opposite electrode that is integrally provided over the first buffer layer, the second buffer layer, and the third buffer layer, wherein a lowest unoccupied molecular orbital (LUMO) energy level of the first buffer layer has a value between a work function of the opposite electrode and the LUMO energy level of the first emission layer.

The method may further include forming an electronic control layer that is integrally provided over the first buffer layer, the second buffer layer, and the third buffer layer; and forming an opposite electrode that is integrally provided on the electronic control layer, wherein a lowest unoccupied molecular orbital (LUMO) energy level of each of the first to third buffer layers has a value between the LUMO energy level of the electronic control layer and the LUMO energy level of each of the first to third emission layers.

A highest occupied molecular orbital (HOMO) energy level of the first buffer layer may be greater than the HOMO energy level of the first emission layer.

The first buffer layer may include at least one selected from a low molecular weight organic material, an electron transport material, and a metal oxide material.

End portions of the first hole control layer, the first emission layer, and the first buffer layer, which are above the first pixel electrode, may be aligned with one another.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
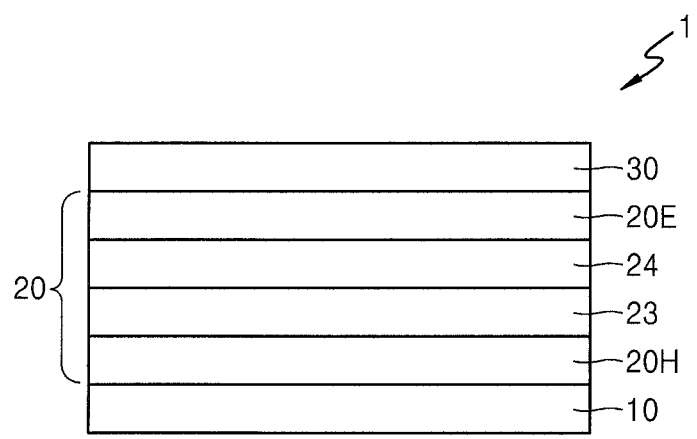
FIG. 1 is a cross-sectional view schematically illustrating a stack structure of an organic light-emitting device according to an embodiment.

As the present disclosure allows for various changes and numerous embodiments, embodiments of the present disclosure will be illustrated in the drawings and described in more detail in the written description. However, this is not intended to limit the present disclosure to particular modes of practice, and it is to be appreciated that all changes, equivalents, and substitutes that do not depart from the spirit and technical scope of the present disclosure are encompassed by the present disclosure. In the present disclosure, certain detailed explanations of the related art are not provided when they would render the disclosure unclear.

The subject matter of the present disclosure will now be described in more detail with reference to the accompanying drawings, in which embodiments of the disclosure are shown. Throughout the drawings, like reference numerals denote like elements. In the following description, when detailed descriptions about related well-known functions or structures would render the present disclosure unclear, those detailed descriptions will not be provided.

It will be understood that although the terms "first," "second," etc. may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. Furthermore, it will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular (e.g., substantially perpendicular) to one another, or may represent different directions that are not perpendicular to one another.

When a certain embodiment may be implemented differently, a specific process order may be performed differently from the described order. For example, two consecutively described processes may be performed concurrently (e.g., substantially at the same time) or performed in an order opposite to the described order.

FIG. 1 is a cross-sectional view schematically illustrating a stack structure of an organic light-emitting device 1 according to an embodiment.

Referring to FIG. 1, an organic light-emitting display apparatus according to an embodiment may include the organic light-emitting device 1. The organic light-emitting device 1 may include a pixel electrode 10, an opposite electrode 30 above the pixel electrode 10, and an intermediate layer 20 between the pixel electrode 10 and the opposite electrode 30. The intermediate layer 20 may include a hole control layer 20H, an emission layer 23 on the hole control layer 20H, a buffer layer 24 on the emission layer 23, and an electronic control layer 20E on the buffer layer 24. In this case, the hole control layer 20H may optionally include a hole injection layer 21 (see FIG. 4) and a hole transport layer 22 (see FIG. 4), and the electronic control layer 20E may optionally include an electron injection layer 26 (see FIG. 4) and an electron transport layer 25 (see FIG. 4).

In the present embodiment, the buffer layer 24 may be on the emission layer 23. The electronic control layer 20E, which optionally includes the electron injection layer 26 and the electron transport layer 25, may be on the buffer layer 24, or the opposite electrode 30 may be directly on the buffer layer 24 without the electronic control layer 20E therebetween.

The buffer layer 24 may include an organic material and/or a metal oxide material. When the buffer layer 24 includes an organic material, the buffer layer 24 may include, for example, a low molecular weight organic material including at least one selected from BAlq (bis(2-methyl-8-quinolinolate)-4-(phenylphenolato)aluminium), BCP (2,9-dimethyl-4,7-diphenyl-1,10-phenanthroline), DTBT (Dithienylbenzothiadiazole), TPBi (1,3,5-tris(N-phenylbenzimiazole-2-yl)benzene), PBD (2-(4-biphenyl)-5-(4-tert-butylphenyl)-1,3,4oxadiazole), TAZ (3-(4-biphenyl)4-phenyl-5-tert-butylphenyl-1,2,4-triazole), C60F42, Liq (8-hydroxyquinolinolato-lithium), and spiro-PBD, and/or at least one selected from an oligomer, polymer, and a copolymer derivative based on the low molecular weight organic material.

Furthermore, when the buffer layer 24 includes an organic material, the buffer layer 24 may include, for example, BND, OXD-7, OXD-star, Alq3(tris-(8-hydroyquinolato) aluminum(III)), Bphen, NTAZ, Bphen (4,7-diphenyl-1,10-phenanthroline), NTAZ (4-(naphthalen-1-yl)-3,5-diphenyl-4H-1,2,4-triazole), t-Bu-PBD (2-(4-biphenylyl)-5-(4-tert-butyl-phenyl)-1,3,4-oxadiazole), t-Bu-PND, Bebq2 (Bis(10-hydroxybenzo[h]quinolinato)beryllium), ADN (9,10-bis(2-naphthyl)anthracene), or a mixture thereof.

Furthermore, when the buffer layer 24 includes a metal oxide material, the buffer layer 24 may include, for example, $CuO_x$, $MoO_x$, $WO_x$, $ZnO$, or a mixture thereof. In this case, a doping material may be added to the buffer layer 24 to improve electrical properties of the buffer layer 24 and to secure process stability.

Furthermore, when the buffer layer 24 includes an organic material, the organic material may have a structure in which, for example, at least some of the molecules are cross-linked with each other by way of a chemical a bond such as a C—O, C—C, C—N, C—S, C=C, and/or C=O bond, to have a bonding energy of 60 kcal/mol or more.

In the present embodiment, the buffer layer 24 that is directly on the emission layer 23 may protect the emission layer 23 from being damaged and oxidized in a subsequent process. This is described herein below in more detail in the description of a manufacturing method shown in FIG. 6 and the description and drawings following thereafter.

Figure 2:
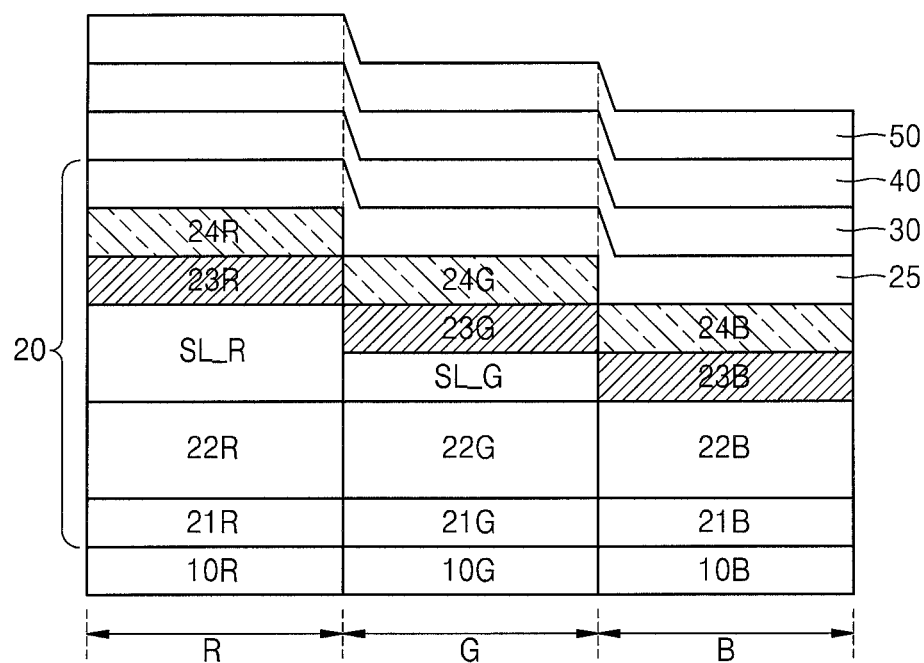
FIG. 2 is a cross-sectional view schematically illustrating a stack structure of pixels according to an embodiment.

FIG. 2 is a cross-sectional view schematically illustrating a stack structure of pixels R, G, and B according to an embodiment.

Referring to FIG. 2, an organic light-emitting display apparatus according to an embodiment may include a plurality of pixel electrodes 10R, 10G, and 10B. Although FIG. 2 illustrates that, for convenience of explanation, the pixel electrodes 10R, 10G, and 10B are in contact with one another, the pixel electrodes 10R, 10G, and 10B may be patterned to be spaced apart from one another.

The pixel electrodes 10R, 10G, and 10B may include a first pixel electrode 10R for red (R) emission (e.g., the first pixel electrode 10R emits light having a red color), a second pixel electrode 10G for green (G) emission (e.g., the second pixel electrode 10G emits light having a green color), and a third pixel electrode 10B for blue (B) emission (e.g., the first pixel electrode 10B emits light having a blue color). First, second, and third hole injection layers 21R, 21G, and 21B and first, second, and third hole transport layers 22R, 22G, and 22B may be respectively on and above the first, second, and third pixel electrodes 10R, 10G, and 10B. The first, second, and third hole injection layers 21R, 21G, and 21B and the first, second, and third hole transport layers 22R, 22G, and 22B may correspond to the hole control layer 20H described in FIG. 1. In the present embodiment, although the hole control layer 20H includes all of the first, second, and third hole injection layers 21R, 21G, and 21B and the first, second, and third hole transport layers 22R, 22G, and 22B, the hole control layer 20H may, optionally, selectively include the first, second, and third hole injection layers 21R, 21G, and 21B and the first, second, and third hole transport layers 22R, 22G, and 22B, as is desired or necessary. For example, the hole control layer 20H may include only the first, second, and third hole injection layers 21R, 21G, and 21B, or the hole control layer 20H may include only the first, second, and third hole transport layers 22R, 22G, and 22B. In some embodiments, the hole control layer 20H may include only one of the first, second, and third hole injection layers 21R, 21G, and 21B, or the hole control layer 20H may include only one of the first, second, and third hole transport layers 22R, 22G, and 22B.

The first, second, and third hole injection layers 21R, 21G, and 21B may include, for example, a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA(4,4',4''-tris(3-methylphenylphenylamino) triphenylamine), TDATA(4,4'4''-Tris (N,N-diphenylamino)triphenylamine), 2TNATA(4,4',4''-tris{N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonic acid), and/or PANI/PSS((Polyaniline)/Poly(4-styrenesulfonate, but a material included the hole injection layers is not limited to the above-described compounds.

The first, second, and third hole transport layers 22R, 22G, and 22B may include, for example, N-phenylcarbazole, a carbazole-based derivative such as polyvinylcarbazole, a fluorine-based derivative, TPD(N,N'-bis(3-methylphenyl)-N,N'-diphenyl-[1,1-biphenyl]-4,4'-diamine), a triphenylamine-based derivative such as TCTA(4,4',4''-tris (N-carbazolyl)triphenylamine), NPB(N,N'-di(1-naphthyl)-N,N'-diphenylbenzidine), and/or TAPC(4,4'-Cyclohexylidene bis[N,N-bis(4-methylphenyl)benzenamine]), but the present disclosure is not limited thereto.

First, second, and third emission layers 23R, 23G, and 23B may be respectively on the first, second, and third hole transport layers 22R, 22G, and 22B. In other words, the red (R) emission layer 23R may be on the first pixel electrode 10R, the green (G) emission layer 23G may be on the second pixel electrode 10G, and the blue (B) emission layer 23B may be on the third pixel electrode 10B.

As an optional embodiment, a first auxiliary layer SL_R corresponding to a resonance control layer may be between the first hole transport layer 22R and the first emission layer 23R. Furthermore, a second auxiliary layer SL_G corresponding to a resonance control layer may be between the second hole transport layer 22G and the second emission layer 23G. As necessary or desired, an auxiliary layer may be provided between the third hole transport layer 22B and the third emission layer 23B.

First, second, and third buffer layers 24R, 24G, and 24B may be respectively on the first, second, and third emission layers 23R, 23G, and 23B. In other words, the first buffer layer 24R may be on the red (R) emission layer 23R, the second buffer layer 24G may be on the green (G) emission layer 23G, and the third buffer layer 24B may be on the blue (B) emission layer 23B. The first, second, and third buffer layers 24R, 24G, and 24B may correspond to the buffer layer 24 described in FIG. 1.

The electron transport layer 25 may be on the first, second, and third buffer layers 24R, 24G, and 24B. The electron transport layer 25, which is a common layer, may be integrally provided on the first, second, and third buffer layers 24R, 24G, and 24B. The electron transport layer 25 may include, for example, Alq3(Tris(8-hydroxyquinolinato) aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate), ADN(9,10-di(naphthalene-2-yl)anthracene), or a mixture thereof, but the present disclosure is not limited thereto.

Figure 4:
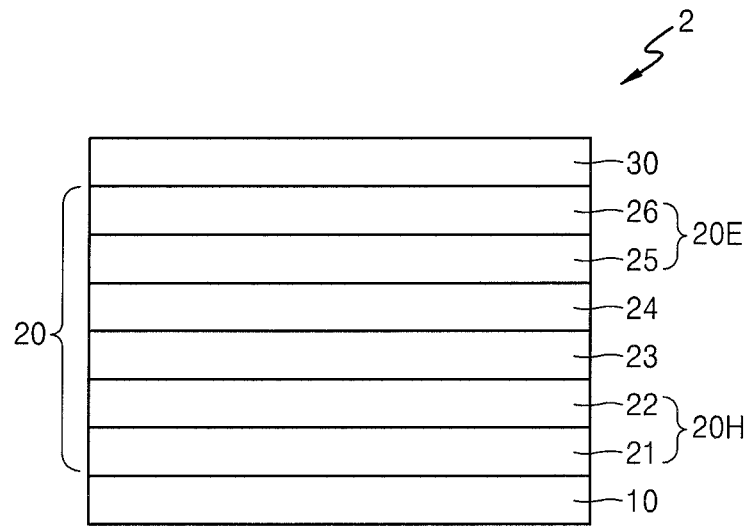
FIG. 4 is a cross-sectional view schematically illustrating a stack structure of an organic light-emitting device according to another embodiment.

In some embodiments, the electron injection layer 26 may be further provided between the opposite electrode 30 and the electron transport layer 25, as shown in FIG. 4. The electron injection layer 26 may include, for example, a lanthanum series metal (or a compound including a lanthanum series metal) such as LiF, LiQ (Lithium quinolate), Li$_2$O, BaO, NaCl, CsF, or Yb, or a halogenated metal such as RbCl or Rbl, but the present disclosure is not limited thereto.

Referring back to FIG. 2, the opposite electrode 30 may be over the first, second, and third buffer layers 24R, 24G, and 24B. The opposite electrode 30, which is a common layer, may be integrally provided on the electron transport layer 25.

Optionally, a capping layer 40 and an encapsulation layer 50 may be further provided on the opposite electrode 30.

As illustrated in FIG. 2, the electron transport layer 25, the opposite electrode 30, the capping layer 40, and the encapsulation layer 50, which are on the first, second, and third buffer layers 24R, 24G, and 24B, may be provided as common layers. In contrast, layers under the first, second, and third buffer layers 24R, 24G, and 24B may be provided by being patterned for each pixel. In other words, the first, second, and third pixel electrodes 10R, 10G, and 10B may be patterned for each pixel, a pixel defining film may be provided to cover edges of the first, second, and third pixel electrodes 10R, 10G, and 10B, the first, second, and third hole injection layers 21R, 21G, and 21B, the first, second, and third hole transport layers 22R, 22G, and 22B, the first, second, and third emission layers 23R, 23G, and 23B, and the first, second, and third buffer layers 24R, 24G, and 24B may be patterned and provided on the first, second, and third pixel electrodes 10R, 10G, and 10B which are exposed through an opening of the pixel defining film. This is described herein below in more detail in the description of the manufacturing method illustrated in FIG. 6 and the description and drawings following thereafter.

Figure 3:
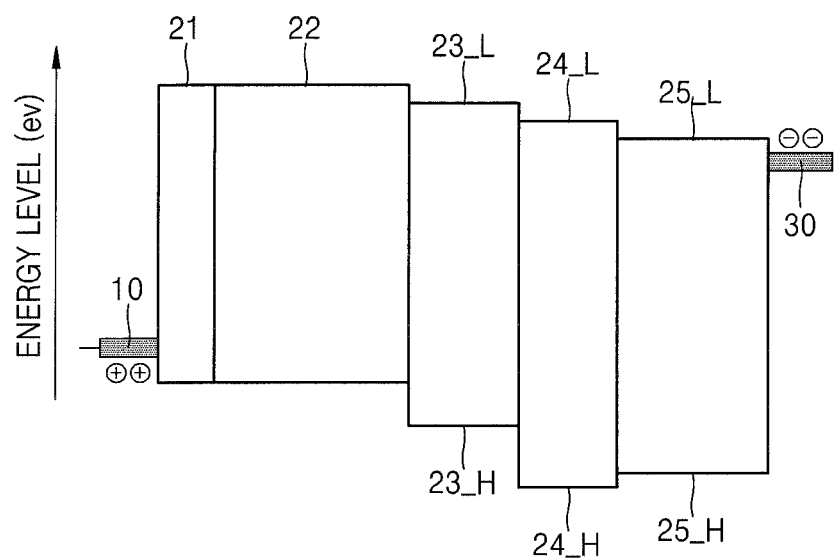
FIG. 3 is an energy bandgap diagram of an organic light-emitting device according to an embodiment.

FIG. 3 is an energy bandgap diagram of an organic light-emitting device according to an embodiment.

In FIG. 3, an organic light-emitting device including the hole injection layer 21, the hole transport layer 22, the emission layer 23, the buffer layer 24, and the electron transport layer 25 between the pixel electrode 10 and the opposite electrode 30 is illustrated.

Referring to FIG. 3, according to an embodiment, a highest occupied molecular orbital (HOMO) energy level 24H of the buffer layer 24 may be characteristically greater than a HOMO energy level 23_H of the emission layer 23. In an embodiment in which the electron transport layer 25 is on the buffer layer 24, a lowest unoccupied molecular orbital (LUMO) energy level 24_L of the buffer layer 24 may have a value between a LUMO energy level 25_L of the electron transport layer 25 and a LUMO energy level 23_L of the emission layer 23.

In another embodiment, an organic light-emitting display apparatus according to an embodiment may include an organic light-emitting device including the hole injection layer 21, the hole transport layer 22, the emission layer 23, and the buffer layer 24 between the pixel electrode 10 and the opposite electrode 30.

In this case, the HOMO energy level 24_H of the buffer layer 24 may be characteristically greater than the HOMO energy level 23_H of the emission layer 23. Furthermore, the LUMO energy level 24_L of the buffer layer 24 may have a value between a work function of the opposite electrode 30 and the LUMO energy level 23_L of the emission layer 23.

The buffer layer 24 according to an embodiment is directly on the emission layer 23 to protect the emission layer 23 from being damaged and oxidized in a subsequent process. However, there is an issue of efficiency of an organic light-emitting device being degraded due to the buffer layer 24 provided in the intermediate layer 20, which needs to be addressed. Accordingly, the characteristics of the buffer layer 24 are to prevent the holes injected from the pixel electrode 10 into the emission layer 23 from being transmitted to the electron transport layer 25 or the opposite electrode 30 (or to reduce the transmission of the holes to the electron transport layer 25 or the opposite electrode 30), and thus the buffer layer 24 may prevent or reduce the degradation of the characteristics of an organic light-emitting device.

Figure 5:
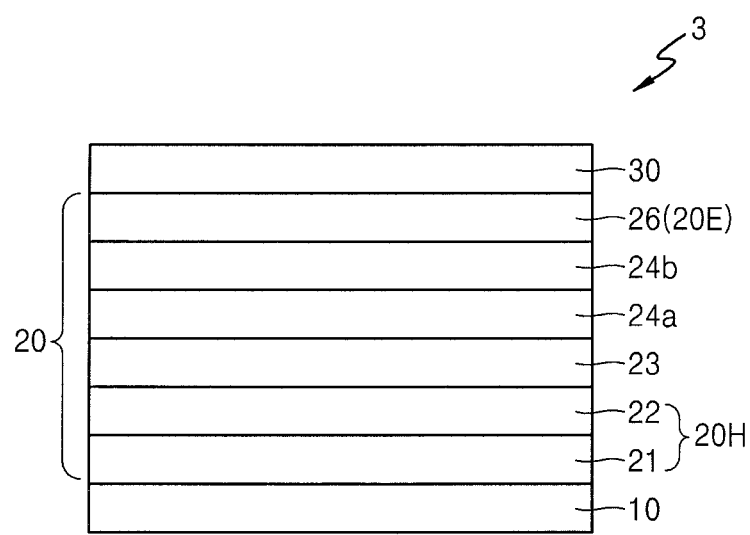
FIG. 5 is a cross-sectional view schematically illustrating a stack structure of an organic light-emitting device according to another embodiment.

FIG. 4 is a cross-sectional view schematically illustrating a stack structure of an organic light-emitting device 2 according to another embodiment. FIG. 5 is a cross-sectional view schematically illustrating a stack structure of an organic light-emitting device 3 according to another embodiment.

Referring to FIG. 4, an organic light-emitting display apparatus according to another embodiment may include the organic light-emitting device 2. The organic light-emitting device 2 of FIG. 4 is substantially the same as the organic light-emitting device 1 of FIG. 1, except that the hole control layer 20H includes the hole injection layer 21 and the hole transport layer 22, and that the electronic control layer 20E includes the electron injection layer 26 and the electron transport layer 25.

The organic light-emitting device 2 may include the pixel electrode 10, the opposite electrode 30 above the pixel electrode 10, and the intermediate layer 20 between the pixel electrode 10 and the opposite electrode 30. The intermediate layer 20 may include the hole injection layer 21, the hole transport layer 22 on the hole injection layer 21, the emission layer 23 on the hole transport layer 22, the buffer layer 24 on the emission layer 23, the electron transport layer 25 on the buffer layer 24, and the electron injection layer 26 on the electron transport layer 25.

Referring to FIG. 5, an organic light-emitting display apparatus according to another embodiment may include the organic light-emitting device 3. The organic light-emitting device 3 illustrated in FIG. 5 is substantially the same as the embodiment of FIG. 1, except that the hole control layer 20H includes the hole injection layer 21 and the hole transport layer 22, that the electronic control layer 20E includes the electron injection layer 26, and that the organic light-emitting device 3a includes a first buffer layer 24a and a second buffer layer 24b.

The organic light-emitting device 3 may include the pixel electrode 10, the opposite electrode 30 above the pixel electrode 10, and the intermediate layer 20 between the pixel electrode 10 and the opposite electrode 30. The intermediate layer 20 may include the hole injection layer 21, the hole transport layer 22 on the hole injection layer 21, the emission layer 23 on the hole transport layer 22, the first buffer layer 24a on the emission layer 23, the second buffer layer 24b on the first buffer layer 24a, and the electron injection layer 26 on the second buffer layer 24b.

The above-described embodiments of FIGS. 4-5 are example embodiments, and the present disclosure is not limited to the thicknesses of the layers illustrated in the drawings. The thickness and number of the buffer layer 24 may vary according to the configuration of the intermediate layer 20.

Although an organic light-emitting display apparatus is mainly described in the above description, the present disclosure is not limited thereto. For example, a method of manufacturing the above-described organic light-emitting display apparatus is also within the scope of the present disclosure.

FIGS. 6-10E are cross-sectional views schematically illustrating a manufacturing process of an organic light-emitting display apparatus according to an embodiment.

Figure 6:
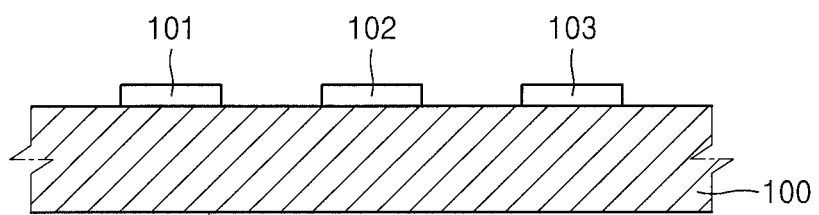
FIG. 6 is a cross-sectional view schematically illustrating a manufacturing process of an organic light-emitting display apparatus according to another embodiment.

First, referring to FIG. 6, a first pixel electrode 101 for first color emission (e.g., a first pixel electrode configured to emit a first color of light), a second pixel electrode 102 for second color emission (e.g., a second pixel electrode configured to emit a second color of light), and a third pixel electrode 103 for third color emission (e.g., a third pixel electrode configured to emit a third color of light) may be formed on a substrate 100. The first pixel electrode 101, the second pixel electrode 102, and the third pixel electrode 103 may be patterned to be arranged spaced apart from one another.

The arrangement of the first, second, and third pixel electrodes 101, 102, and 103 on the substrate 100 may include not only a case in which the first, second, and third pixel electrodes 101, 102, and 103 are directly arranged on the substrate 100, but also a case in which various suitable layers are formed on the substrate 100 and the first, second, and third pixel electrodes 101, 102, and 103 are arranged on the various suitable layers. For example, a thin film transistor may be on the substrate 100, a planarization film may cover the thin film transistor, and the first, second, and third pixel electrodes 101, 102, and 103 may be on the planarization film. Although the drawings illustrate that, for convenience of explanation, the first, second, and third pixel electrodes 101, 102, and 103 are directly on the substrate 100, the above description may also apply to the following description, for convenience of explanation.

The substrate 100 may be formed of various suitable materials. For example, the substrate 100 may be formed of glass and/or plastic. The substrate 100 may be formed of a material having excellent heat resistance and durability such as polyimide, polyethylenenaphthalate, polyethyleneterephthalate, polyarylate, polycarbonate, polyetherimide, and/or polyethersulfone.

The first, second, and third pixel electrodes 101, 102, and 103 formed on the substrate 100 may be formed as (semi-)transparent electrodes or reflective electrodes. When the first, second, and third pixel electrodes 101, 102, and 103 are formed as (semi)transparent electrodes, the first, second, and third pixel electrodes 101, 102, and 103 may be formed of, for example, ITO, IZO, ZnO, $In_2O_3$, IGO, and/or AZO. When the first, second, and third pixel electrodes 101, 102, and 103 are formed as reflective electrodes, each of the first, second, and third pixel electrodes 101, 102, and 103 may have a reflective film formed of Ag, Mg, Al, Pt, Pd, Au, Ni, Nd, Ir, Cr, and/or a compound thereof and a layer formed of ITO, IZO, ZnO, $In_2O_3$, IGO, and/or AZO. The present disclosure is not limited thereto, and a variety of suitable modifications may be made. For example, the first, second, and third pixel electrodes 101, 102, and 103 may be formed of various suitable materials in a single layer or a multilayer.

Figure 7:
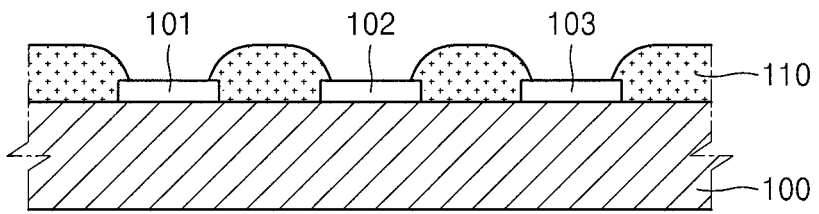
FIG. 7 is a cross-sectional view schematically illustrating a manufacturing process of an organic light-emitting display apparatus according to another embodiment.

Next, as illustrated in FIG. 7, a pixel defining film 110 that exposes a center portion of each of the first pixel electrode 101, the second pixel electrode 102, and the third pixel electrode 103 and covers an edge portion thereof may be formed. The pixel defining film 110 defines a pixel area and prevents or reduces generation of arcs during driving as an electric field concentrates on end portions of the first, second, and third pixel electrodes 101, 102, and 103.

The pixel defining film 110 may be provided as, for example, an organic insulating film. An organic insulating film may include an acrylic-based polymer such as polymethyl methacrylate (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, or a mixture thereof.

Next, as illustrated in FIGS. 8A-8H, an intermediate layer 101A (see FIG. 8H) may be formed on the first pixel electrode 101. The intermediate layer 101A may mean a first hole injection layer 141, a first hole transport layer 151, a first emission layer 161, and a first buffer layer 171. An electronic control layer such as an electron transport layer may be further formed in a subsequent process.

The processes of FIGS. 8A-8H may be construed as a first unit process corresponding to the first pixel electrode 101. Then, a second unit process corresponding to the second pixel electrode 102 may be performed through processes of FIGS. 9A-9E, and a third unit process corresponding to the third pixel electrode 103 may be performed through processes of FIGS. 10A-10E. In this case, the first unit process, the second unit process, and the third unit process may be the same process that is repeatedly performed.

Figure 8A:
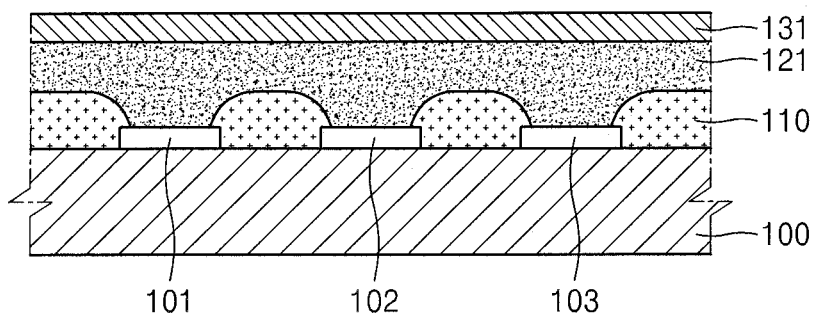
FIGS. 8A-8H are cross-sectional views schematically illustrating a manufacturing process of an organic light-emitting display apparatus according to another embodiment.

First, referring to FIG. 8A, a first lift-off layer 121 including a fluoropolymer may be formed on the first pixel electrode 101, the second pixel electrode 102, and the third pixel electrode 103. The fluoropolymer included in the first lift-off layer 121 may be formed as a polymer including a fluorine content of 20 to 60 wt %. For example, the fluoropolymer may include at least one copolymer selected from a copolymer of polytetrafluoroethylene, polychlorotrifluoroethylene, polydichlorodifluoroethylene, chlorotrifluoroethylene, and dichlorodifluoroethylene; a copolymer of tetrafluoroethylene and perfluoroalkylvinylether; a copolymer of chlorotrifluoroethylene and perfluoro alkyl vinyl ether; a copolymer tetrafluoroethylene; and a copolymer of chlorotrifluoroethylene and perfluoroalkylvinylether.

The first lift-off layer 121 may be formed on the substrate 100 by a method such as a coating method, a printing method, or a deposition method. When the first lift-off layer 121 is formed by a coating method and a printing method, a process of forming photoresist may be performed after performing curing and polymerization as necessary.

The thickness of the first lift-off layer 121 may be between 0.2 μm and 5.0 μm. When the thickness of the first lift-off layer 121 is too large, a time to melt the first lift-off layer 121 for patterning may increase, and thus a manufacturing processing time may be extended. When the thickness of the first lift-off layer 121 is too small, it is difficult to perform lift off.

The first lift-off layer 121 may further include a moisture absorbent. The moisture absorbent may include various suitable materials. The moisture absorbent may be a compound in which metals such as calcium (e.g., calcium oxide), barium (e.g., barium oxide), aluminum (e.g., aluminum oxide), and/or magnesium (e.g., magnesium oxide) are coupled (or connected) by oxygen, and may include a material that forms metal hydroxide when reacting with water. Furthermore, the moisture absorbent may include any one selected from a group consisting of a metal halide, an inorganic salt of metal, an organic acid salt, a porous inorganic compound, and a combination thereof. The moisture absorbent may include an acrylic-based, methacrylic-based, polyisoprene-based, vinyl-based, epoxy-based, urethane-based, and/or cellulosic-based organic material. The moisture absorbent may include a titania-, silicon oxide-, zirconia-, and/or alumina-based inorganic material. The moisture absorbent may include a sealant manufactured from epoxy silane, vinyl silane, amine silane, and/or methacrylate silane. The moisture absorbent may capture moisture generated during the first unit process and thus prevent or reduce degradation of the first emission layer 161 formed during the first unit process.

A first photoresist 131 may be formed on the first lift-off layer 121. The first photoresist 131 may be exposed or developed by using a first photomask. The first photoresist 131 may be of either a positive type (or kind) or a negative type (or kind). In the present embodiment, an example of a positive type (or kind) is described herein below.

Figure 8B:
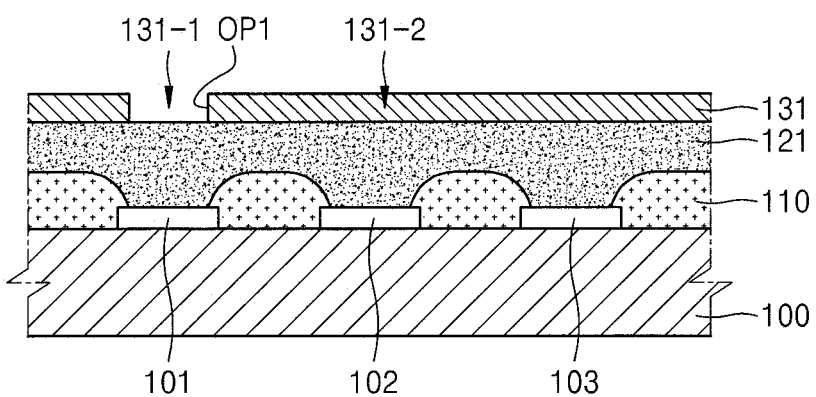

Referring to FIG. 8B, the first photoresist 131 is patterned. The first photoresist 131 that is exposed and developed is removed from a first portion 131-1 that is a position corresponding to the first pixel electrode 101, and the first photoresist 131 remains in a second portion 131-2 that is an area other than the first portion 131-1. A first opening OP1 may be formed in the first photoresist 131 corresponding to the first portion 131-1.

Figure 8C:
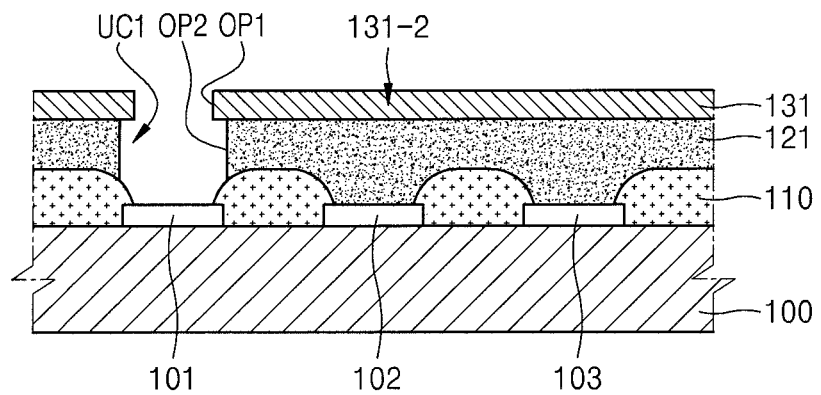

Referring to FIG. 8C, the first lift-off layer 121 is etched by using a pattern of the first photoresist 131 of FIG. 8B as an etch mask.

Since the first lift-off layer 121 includes a fluoropolymer, a solvent capable of etching the fluoropolymer may be used as an etchant. A first solvent including fluorine may be used as an etchant. The first solvent may include a hydrofluoroether. Hydrofluoroethers are electrochemically stable material due to low interaction reactivity with other materials, and are also an environmentally stable material due to a low global warming potential and low toxicity.

In an etching process, the first lift-off layer 121 formed at a position corresponding to the first portion 131-1, that is, on an upper side of the first pixel electrode 101, is etched. The first lift-off layer 121 is etched to be spaced apart a set or certain distance from a side surface of the first pixel electrode 101 by forming a first undercut profile UC1 under a boundary surface of the first portion 131-1 of the first photoresist 131. Accordingly, a second opening OP2 may be formed in the first lift-off layer 121 corresponding to the first portion 131-1. The first pixel electrode 101 may be exposed through the second opening OP2.

Figure 8D:
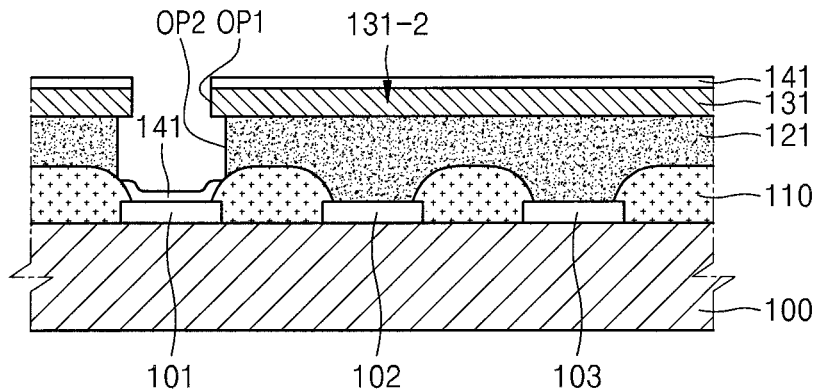

Referring to FIG. 8D, an intermediate layer may be formed on the first photoresist 131. The intermediate layer may include the first emission layer 161. Furthermore, the intermediate layer may further include at least one selected from organic functional layers such as a hole injection layer, a hole transport layer, an electron transport layer, and an electron injection layer.

In the present embodiment, a case in which the intermediate layer includes a hole injection layer, a hole transport layer, and an electron transport layer is described as an example, but the present disclosure is not limited thereto.

In the present embodiment, the intermediate layer may be formed by a vacuum deposition method. In a deposition process, the first lift-off layer 121 and the first photoresist 131 perform a deposition mask function. A part of the intermediate layer may cover an upper surface of the first pixel electrode 101. The other part of the intermediate layer is formed on the second portion 131-2 of the first photoresist 131.

Referring to FIG. 8D, the first hole injection layer 141 is formed on the structure of FIG. 8C. A part of the first hole injection layer 141 may be formed on the first pixel electrode 101 through the first opening OP1 and the second opening OP2 formed in the first photoresist 131 and the first lift-off layer 121, which serve as a mask. The other part of the first hole injection layer 141 may be formed on the second portion 131-2 of the first photoresist 131.

Figure 8E:
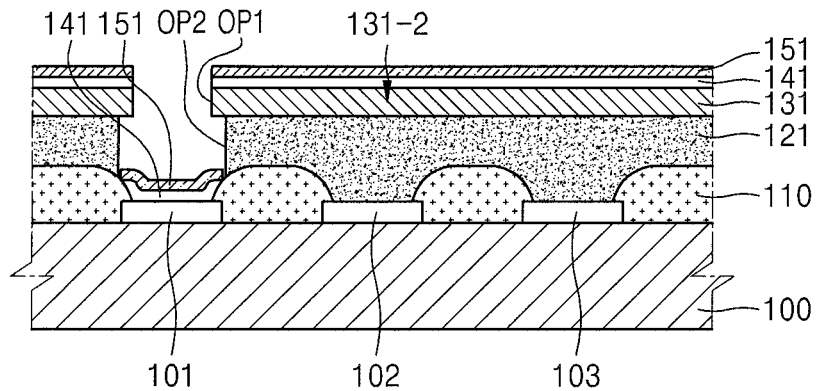

Next, referring to FIG. 8E, the first hole transport layer 151 is formed on the structure of FIG. 8D. A part of the first hole transport layer 151 may be formed on the first hole injection layer 141 corresponding to the first pixel electrode 101 through the first opening OP1 and the second opening OP2. Other part of the first hole transport layer 151 may be formed on the second portion 131-2 on which the first hole injection layer 141 is formed.

Figure 8F:
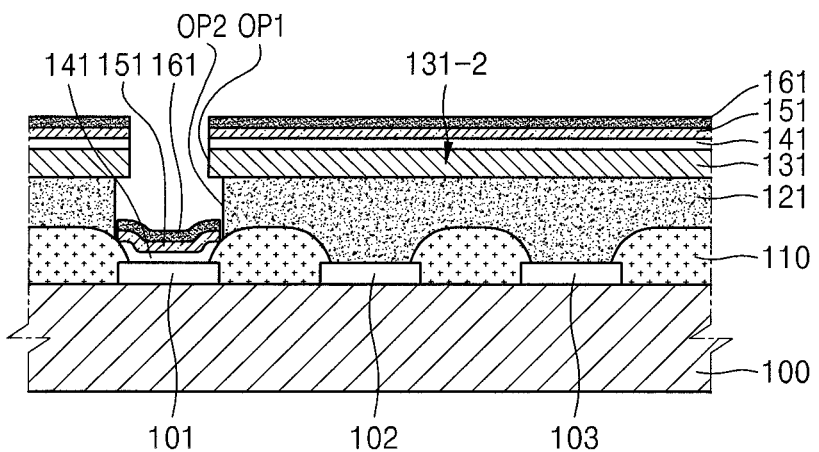

Next, referring to FIG. 8F, the first emission layer 161 is formed on the structure of FIG. 8E. A part of the first emission layer 161 may be formed on the first hole transport layer 151 corresponding to the first pixel electrode 101 through the first opening OP1 and the second opening OP2. Other part of the first emission layer 161 may be formed on the second portion 131-2 on which the first hole transport layer 151 is formed. In the present embodiment, the first emission layer 161 may be a red emission layer (e.g., a layer configured to emit red light), but the present disclosure is not limited thereto.

Figure 8G:
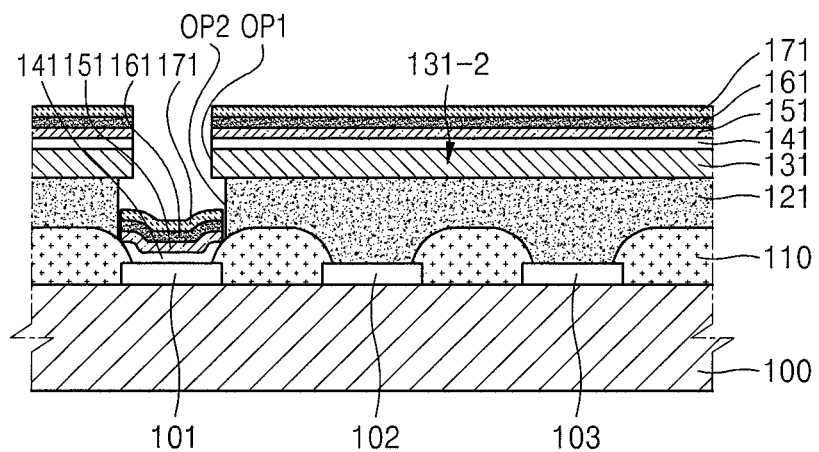

Next, referring to FIG. 8G, the first buffer layer 171 may be formed on the structure of FIG. 8F. A part of the first buffer layer 171 may be formed on the first emission layer 161 corresponding to the first pixel electrode 101 through the first opening OP1 and the second opening OP2. Another part of the first buffer layer 171 may be formed on the second portion 131-2 on which the first emission layer 161 is formed.

Since the first buffer layer 171 is formed directly on the first emission layer 161, the first buffer layer 171 may perform a barrier function to protect the first emission layer 161 from the solvent used in subsequent processes after the formation of the first emission layer 161. The first buffer layer 171 includes the same material (e.g., substantially the same material) and has the same (e.g., substantially the same) characteristics as those of the buffer layer 24 described in FIGS. 1-3, and thus, a redundant description thereof is not repeated here.

Figure 8H:
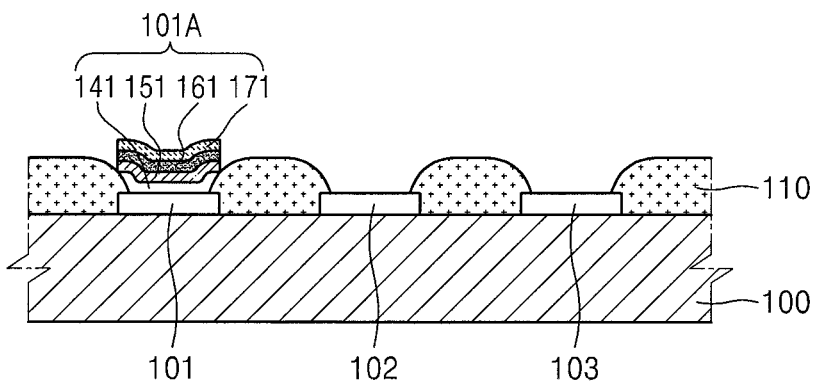

Next, referring to FIG. 8H, a lift-off process is performed on the structure of FIG. 8G.

By lifting off the first lift-off layer 121 formed under the second portion 131-2 of the first photoresist 131, the first hole injection layer 141, the first hole transport layer 151, the first emission layer 161, and the first buffer layer 171, which are formed in the second portion 131-2 of the first photoresist 131, are removed, and thus, the first hole injection layer 141, the first hole transport layer 151, the first emission layer 161, and the first buffer layer 171, which are formed on the first pixel electrode 101, remain as a pattern.

Since the first lift-off layer 121 includes a fluoropolymer, a second solvent including fluorine is used in the lift-off process. Additionally, since the lift-off process is performed after the formation of the first emission layer 161, a material having low reactivity with the first emission layer 161 may be used as the second solvent. For example, the second solvent may include a hydrofluoroether, like the first solvent.

However, in spite of using a material having low reactivity with the first emission layer 161 as the second solvent, there is a problem in that the first emission layer 161 may be damaged during the lift-off process due to a component that decomposes (or dissolves) organic materials.

In a deposition process for forming an organic light-emitting device, a low molecular weight organic material (e.g., small molecules) having advantages in terms of synthetic reproducibility, characteristics, and processability is used as a material used as an organic material. However, in a thin film structure formed of a low molecular weight organic material, the respective molecules interact through van der Waals bonding (e.g., van der Waals forces), hydrogen bonding, and/or π-π stacking bonding, which provide low non-covalent interaction energy of about 30 kcal/mol. Accordingly, the low molecular weight organic material may be easily decomposed (or dissolved) in a solution process such as, for example, an orthogonal solvent process. The organic material decomposed (or dissolved) as described above may damage the emission layer 23, thereby degrading the quality of a pixel.

Accordingly, according to an embodiment, since the first buffer layer 171 is formed directly on the first emission layer 161 so that the first buffer layer 171 covers the first emission layer 161, damage to the first emission layer 161 by the solvent in the subsequent lift-off process may be reduced.

The first unit process of FIGS. 8A-8H may be repeatedly performed in the second unit process of FIGS. 9A-9E and the third unit process of FIGS. 10A-10E, which are described in more detail herein below.

The second unit process corresponding to the second pixel electrode 102 are described herein below with reference to FIGS. 9A-9E.

Figure 9A:
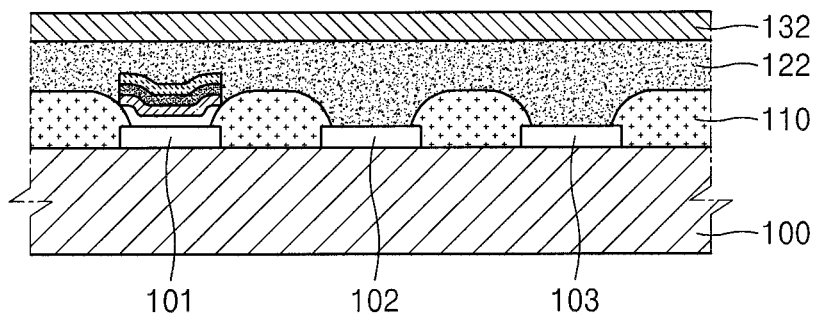
FIGS. 9A-9E are cross-sectional views schematically illustrating a manufacturing process of an organic light-emitting display apparatus according to another embodiment.

Referring to FIG. 9A, a second lift-off layer 122 including a fluoropolymer and a second photoresist 132 may be sequentially formed on the substrate 100 on which the structure of FIG. 8H is formed.

The second lift-off layer 122 may be formed by a method such as a coating method, a printing method, or a deposition method. The second lift-off layer 122 may be formed of the same material (e.g., substantially the same material) as the first lift-off layer 121 that is described herein above.

The second photoresist 132 may be exposed and developed by using a second photomask. The second photoresist 132 may be of either a positive type (or kind) or a negative type (or kind). In the present embodiment, an example of a positive type (or kind) is described herein below.

Figure 9B:
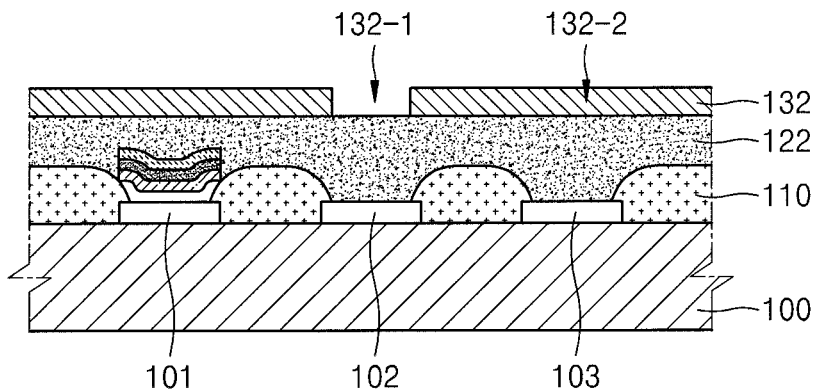

Next, referring to FIG. 9B, the second photoresist 132 is patterned. The second photoresist 132 that is exposed and developed is removed from a first portion 132-1 that is a position corresponding to the second pixel electrode 102, and the second photoresist 132 remains in a second portion 132-2 that is an area other than the first portion 132-1.

Figure 9C:
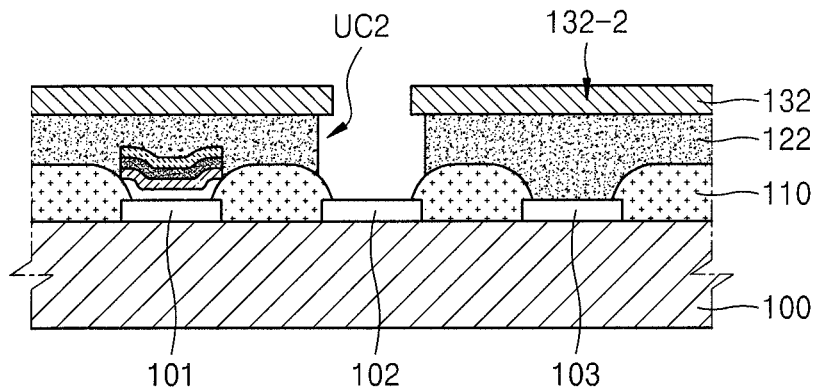

Next, referring to FIG. 9C, the second lift-off layer 122 is etched by using a pattern of the second photoresist 132 of FIG. 9B as an etch mask. Since the second lift-off layer 122 includes a fluoropolymer, a solvent capable of etching the fluoropolymer may be used as an etchant. A first solvent including fluorine may be used as an etchant. The first solvent may include a hydrofluoroether as in the above-described first unit process. The first solvent may include a material different from that used in the first unit process.

The second lift-off layer 122 formed at a position corresponding to a first portion 132-1, for example, on the second pixel electrode 102, is etched by an etching process. The second lift-off layer 122 is etched to be spaced apart a set or certain distance from a side surface of the second pixel electrode 102 by forming a second undercut profile UC2 under a boundary surface of the first portion 132-1 of the second photoresist 132.

Figure 9D:
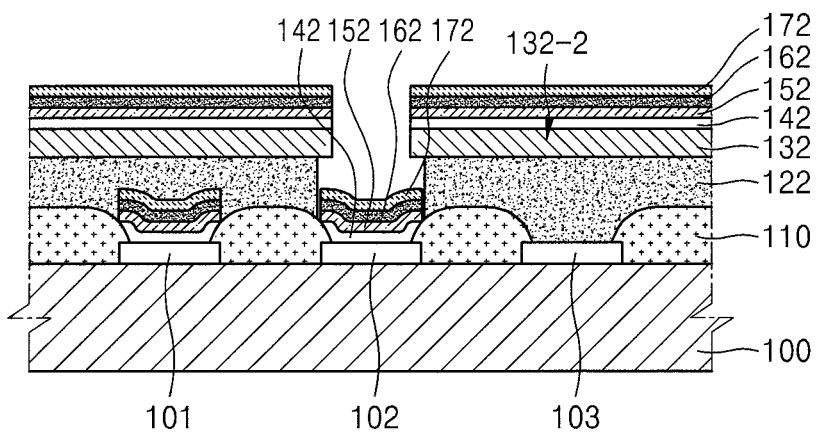

Next, referring to FIG. 9D, as in FIGS. 8D-8G, a second hole injection layer 142, a second hole transport layer 152, a second emission layer 162, and a second buffer layer 172 may be sequentially deposited on the second pixel electrode 102. In the present embodiment, the second emission layer 162 may be a green emission layer (e.g., a layer configured to emit green light), but the present disclosure is not limited thereto.

Figure 9E:
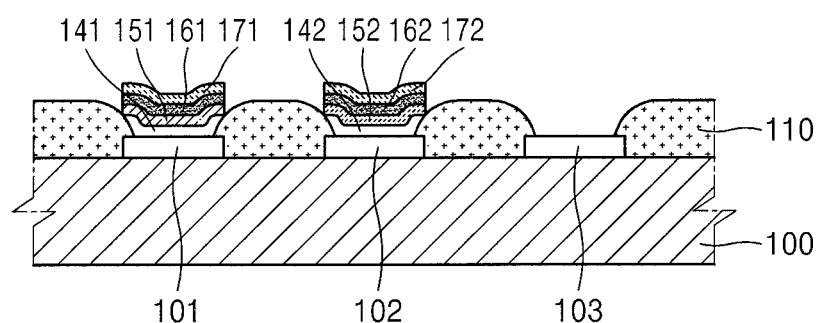

Next, referring to FIG. 9E, a lift-off process is performed on the structure of FIG. 9D.

By lifting off the second lift-off layer 122 formed under a second portion 132-2 of the second photoresist 132, the second hole injection layer 142, the second hole transport layer 152, the second emission layer 162, and the second buffer layer 172, which are formed in the second portion 132-2 of the second photoresist 132, are removed, and the second hole injection layer 142, the second hole transport layer 152, the second emission layer 162, and the second buffer layer 172, which are formed on the second pixel electrode 102, remain as a pattern.

Since the second lift-off layer 122 includes a fluoropolymer, a second solvent including fluorine is used in the lift-off process. Additionally, since the lift-off process is performed after the formation of the second emission layer 162, a material having low reactivity with the second emission layer 162 may be used as the second solvent. For example, the second solvent may include a hydrofluoroether, like the first solvent.

However, in spite of using a material having low reactivity with the second emission layer 162 as the second solvent, there is a problem in that the second emission layer 162 may be damaged during the lift-off process due to a component that decomposes (or dissolves) organic materials.

Concurrently, there is a problem in that damage to the first emission layer 161 may be accumulated because the first emission layer 161 that is first formed in the manufacture of the previous structure is exposed to the second solvent in the lift-off process included in the second unit process, and exposed to the lift-off process several times as each unit process is repeated for each pixel.

Accordingly, in the organic light-emitting display apparatus according to an embodiment, and a manufacturing method thereof, since the first buffer layer 171 is formed on the first emission layer 161, the second buffer layer 172 is formed on the second emission layer 162, and the first buffer layer 171 and the second buffer layer 172 serve as barriers, damage to the first emission layer 161 and the second emission layer 162 during the lift-off process may be reduced.

The third unit process corresponding to the third pixel electrode 103 is described with reference to FIGS. 10A-10E.

Figure 10A:
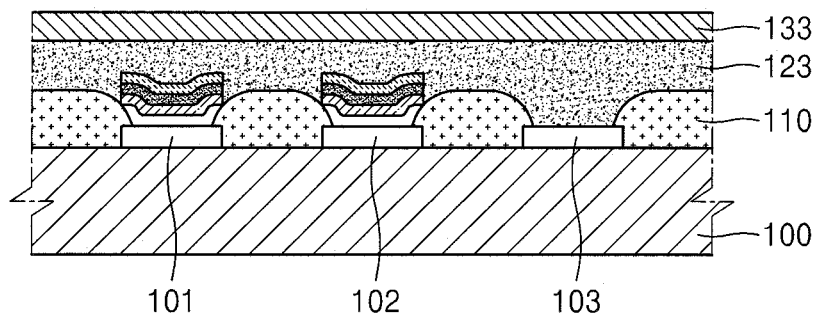
FIGS. 10A-10E are cross-sectional views schematically illustrating a manufacturing process of an organic light-emitting display apparatus according to another embodiment.

Referring to FIG. 10A, a third lift-off layer 123 including a fluoropolymer and a third photoresist 133 may be sequentially formed on the substrate 100 on which the structure of FIG. 9E is formed.

The third lift-off layer 123 may be formed by a method such as a coating method, a printing method, or a deposition method. The third lift-off layer 123 may be formed of the same material (e.g., substantially the same material) as that of the first and second lift-off layers 121 and 122.

The third photoresist 133 may be exposed and developed by using a third photomask. The third photoresist 133 may be of either a positive type (or kind) or a negative type (or kind). In the present embodiment, an example of a positive type (or kind) is described herein below.

Figure 10B:
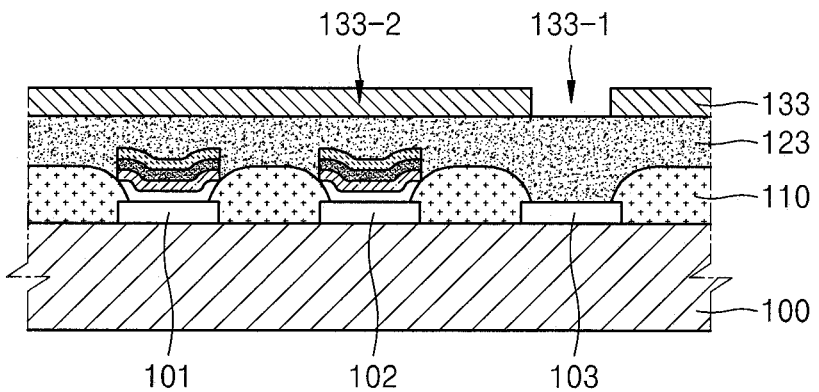

Next, referring to FIG. 10B, the third photoresist 133 is patterned. The third photoresist 133 that is exposed and developed is removed from a first portion 133-1 that is a position corresponding to the third pixel electrode 103, and the third photoresist 133 remains in a second portion 133-2 that is an area other than the first portion 133-1.

Figure 10C:
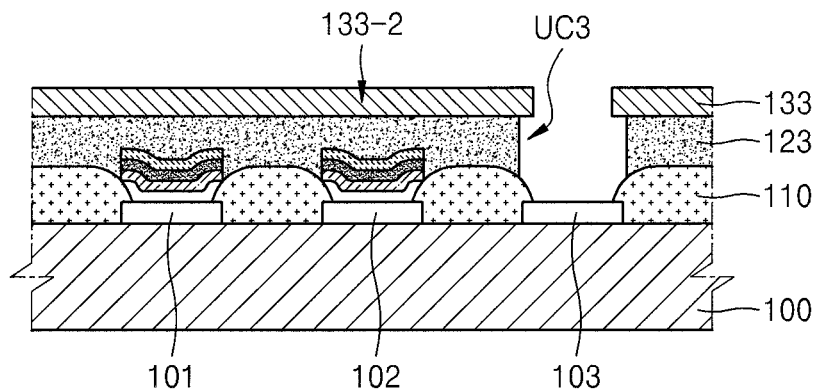

Next, referring to FIG. 10C, the third lift-off layer 123 is etched by using a pattern of the third photoresist 133 of FIG. 10B as an etch mask. Since the third lift-off layer 123 includes a fluoropolymer, a solvent capable of etching the fluoropolymer may be used as an etchant. A first solvent including fluorine may be used as an etchant. The first solvent may include a hydrofluoroether as in the above-described first unit process. The first solvent may include a material different from that used in the first unit process.

The third lift-off layer 123 formed at a position corresponding to a first portion 133-1, for example, on the third pixel electrode 103, is etched by an etching process. The third lift-off layer 123 is etched to be spaced apart a set or certain distance from a side surface of the third pixel electrode 103 by forming a third undercut profile UC3 under a boundary surface of the first portion 133-1 of the third photoresist 133.

Figure 10D:
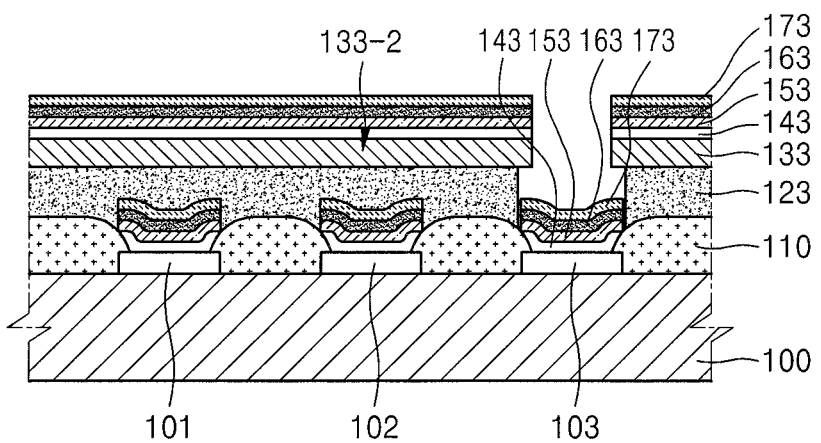

Next, referring to FIG. 10D, as in FIGS. 8D-8G, a third hole injection layer 143, a third hole transport layer 153, a third emission layer 163, and a third buffer layer 173 may be sequentially deposited on the third pixel electrode 103. In the present embodiment, the third emission layer 163 may be a blue emission layer (e.g., a layer configured to emit blue light), but the present disclosure is not limited thereto.

Figure 10E:
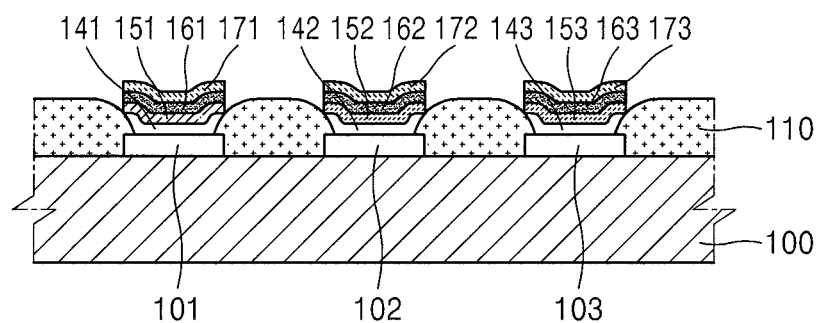

Next, referring to FIG. 10E, a lift-off process is performed on the structure of FIG. 10D.

By lifting off the third lift-off layer 123 formed under a second portion 133-2 of the third photoresist 133, the third hole injection layer 143, the third hole transport layer 153, the third emission layer 163, and the third buffer layer 173, which are formed in the second portion 133-2 of the third photoresist 133, are removed, and the third hole injection layer 143, the third hole transport layer 153, the third emission layer 163, and the third buffer layer 173, which are formed on the third pixel electrode 103, remain as a pattern.

Since the third lift-off layer 123 includes a fluoropolymer, a third solvent including fluorine is used in the lift-off process. Additionally, since the lift-off process is performed after the formation of the third emission layer 163, a material having low reactivity with the third emission layer 163 may be used as the third solvent. Additionally, the third solvent may include a hydrofluoroether, like the first solvent.

However, in spite of using a material having low reactivity with the third emission layer 163 as the third solvent, there is a problem in that the third emission layer 163 may be damaged during the lift-off process due to a component that decomposes (or dissolves) an organic material.

Concurrently, there is a problem in that damage to the first emission layer 161 and the second emission layer 162 may be accumulated because the first emission layer 161 and the second emission layer 162 that are first formed in the previous structures are exposed to the third solvent in the lift-off process included in the third unit process, and exposed to the lift-off process several times as each unit process is repeated for each pixel.

Accordingly, in the organic light-emitting display apparatus according to an embodiment and a manufacturing method thereof, since the first buffer layer 171 is formed on the first emission layer 161, the second buffer layer 172 is formed on the second emission layer 162, the third buffer layer 173 is formed on the third emission layer 163, and the first buffer layer 171, the second buffer layer 172, and the third buffer layer 173 serve as barriers, damage to the respective emission layers during the lift-off process may be reduced.

Referring to FIG. 10E, end portions of the first hole injection layer 141, the first hole transport layer 151, the first emission layer 161, and the first buffer layer 171, which are on the first pixel electrode 101, may be aligned with one another. The end portions being aligned with one another may be understood to be the result of the above-described manufacturing method. In FIGS. 8D-8G, the first hole injection layer 141, the first hole transport layer 151, the first emission layer 161, and the first buffer layer 171 are all patterned by using the first lift-off layer 121 and the first photoresist 131 as a mask through the same opening of the first opening OP1 and the second opening OP2. Accordingly, all of the first hole injection layer 141, the first hole transport layer 151, the first emission layer 161, and the first buffer layer 171 may have the same shape (e.g., substantially the same shape). The same is applied to the second hole injection layer 142, the second hole transport layer 152, the second emission layer 162, and the second buffer layer 172, which correspond to the second pixel electrode 102, and the third hole injection layer 143, the third hole transport layer 153, the third emission layer 163, and the third buffer layer 173, which correspond to the third pixel electrode 103.

Figure 11:
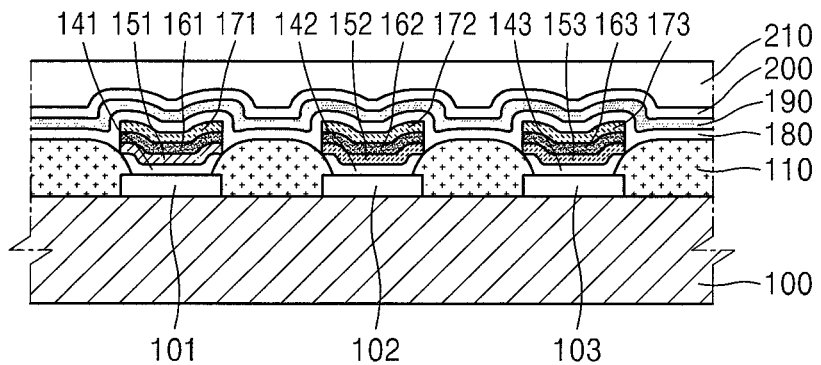
FIG. 11 is a cross-sectional view schematically illustrating a manufacturing process of an organic light-emitting display apparatus according to another embodiment.

Referring to FIG. 11, an electronic control layer 180, an opposite electrode 190, a capping layer 200, and an encapsulation layer 210 may be sequentially deposited, as common layers, on the structure of FIG. 10E.

As described above, according to the above-described embodiments, since damage to the organic light-emitting device in the manufacturing process is reduced, an organic light-emitting display apparatus having improved process stability and reliability, and a manufacturing method thereof, may be implemented. The scope of the present disclosure is not limited by the above-described effect.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display apparatus comprising:
a substrate;
a plurality of pixel electrodes patterned on the substrate and spaced apart from each other;
a pixel defining film defining a pixel area by exposing a center portion of each of the plurality of pixel electrodes and covering an edge of each of the plurality of pixel electrodes;
a plurality of hole control layers respectively arranged on the plurality of pixel electrodes that are exposed through the pixel area;
a plurality of emission layers respectively arranged on the plurality of hole control layers;
a plurality of buffer layers respectively arranged directly on the plurality of emission layers to physically contact the plurality of emission layers, respectively, each of the plurality of buffer layers having a highest occupied molecular orbital (HOMO) energy level greater than the HOMO energy level of each of the plurality of emission layers; and
an opposite electrode integrally provided over the plurality of buffer layers,
wherein end portions of the plurality of hole control layers, the plurality of emission layers, and the plurality of buffer layers, which are on any one of the plurality of pixel electrodes, are aligned with one another.

2. The display apparatus of claim 1, wherein a lowest unoccupied molecular orbital (LUMO) energy level of each of the plurality of buffer layers has a value between a work function of the opposite electrode and the LUMO energy level of each of the plurality of emission layers.

3. The display apparatus of claim 1, wherein each of the plurality of hole control layers comprises at least one selected from a hole injection layer (HIL) and a hole transport layer (HTL).

4. The display apparatus of claim 1, further comprising an electronic control layer that is integrally provided between the plurality of buffer layers and the opposite electrode.

5. The display apparatus of claim 4, wherein the lowest unoccupied molecular orbital (LUMO) energy level of each of the plurality of buffer layers has a value between the LUMO energy level of the electronic control layer and the LUMO energy level of each of the plurality of emission layers.

6. The display apparatus of claim 4, wherein the electronic control layer comprises at least one selected from an electron injection layer (EIL) and an electron transport layer (EML).

7. The display apparatus of claim 1, wherein the plurality of buffer layers comprise a low molecular weight organic material.

8. The display apparatus of claim 1, wherein the plurality of buffer layers comprise an electron transport material.

9. The display apparatus of claim 1, wherein the plurality of buffer layers comprise a metal oxide material.

10. The display apparatus of claim 1, wherein the plurality of pixel electrodes comprise a first pixel electrode configured to emit red light, a second pixel electrode configured to emit green light, and a third pixel electrode configured to emit blue light, and the plurality of emission layers comprise a red emission layer provided corresponding to the first pixel electrode, a green emission layer provided corresponding to the second pixel electrode, and a blue emission layer provided corresponding to the third pixel electrode.

* * * * *